United States Patent [19]

Wetzel, Jr.

[11] Patent Number: 4,545,365

[45] Date of Patent: Oct. 8, 1985

[54] FLUID HEATING SYSTEM UTILIZING SOLAR ENERGY AND WASTE HEAT

[75] Inventor: Otto K. Wetzel, Jr., Dallas, Tex.

[73] Assignee: Wetzel Enterprises, Inc., Dallas, Tex.

[21] Appl. No.: 558,934

[22] Filed: Dec. 7, 1983

[51] Int. Cl.⁴ .............................................. F24J 3/02
[52] U.S. Cl. ..................................... 126/433; 126/427
[58] Field of Search ...................... 126/427, 19.5, 433, 126/434; 237/12.3; 62/235.1; 185/DIG. 2

[56] References Cited

U.S. PATENT DOCUMENTS

| Re. 29,737 | 8/1978 | Bottum . | |
|---|---|---|---|
| 3,299,881 | 1/1967 | Koch | 126/427 |
| 4,026,267 | 8/1977 | Coleman . | |
| 4,026,272 | 5/1977 | Bottum . | |
| 4,044,948 | 8/1977 | Bottum et al. . | |
| 4,049,407 | 9/1977 | Bottum . | |
| 4,103,509 | 8/1978 | Bottum . | |
| 4,120,289 | 10/1978 | Bottum . | |
| 4,130,110 | 12/1978 | Bottum . | |
| 4,142,678 | 3/1979 | Bottum . | |
| 4,147,157 | 4/1979 | Zakhariya . | |
| 4,164,975 | 8/1979 | Bottum . | |
| 4,182,960 | 1/1980 | Reuyl . | |
| 4,185,615 | 1/1980 | Bottum . | |
| 4,203,422 | 5/1980 | Bottum . | |
| 4,211,207 | 7/1980 | Molivadas . | |
| 4,220,138 | 9/1980 | Bottum . | |
| 4,277,946 | 7/1981 | Bottum . | |
| 4,340,030 | 7/1982 | Molivadas . | |
| 4,437,456 | 3/1984 | Merrigan | 126/433 |

FOREIGN PATENT DOCUMENTS 2398980  3/1979  France ................. 62/235.1

Primary Examiner—William E. Lyddane
Assistant Examiner—Gerald Anderson
Attorney, Agent, or Firm—Michael A. O'Neil

[57] ABSTRACT

A fluid heating system includes a thermal collector for vaporizing a refrigerant, a separator for removing any liquid component from the vapor component of the heated refrigerant, and a condenser for transferring heat from the refrigerant vapor to a fluid thereby returning the refrigerant to the liquid phase. Liquid refrigerant is returned from the condenser to the separator, and from the separator to the thermal collector. A pump or a compressor is used to force refrigerant through the refrigerant circuit. The pump or the compressor is actuated by solar energy which is received either from an array of photovoltaic cells or from a generator driven by a turbine which is in turn driven by refrigerant vapor flowing from the separator to the condenser. The thermal collector may be activated by solar energy, or by waste heat resulting from operation of an engine, a building, etc., or both.

3 Claims, 23 Drawing Figures

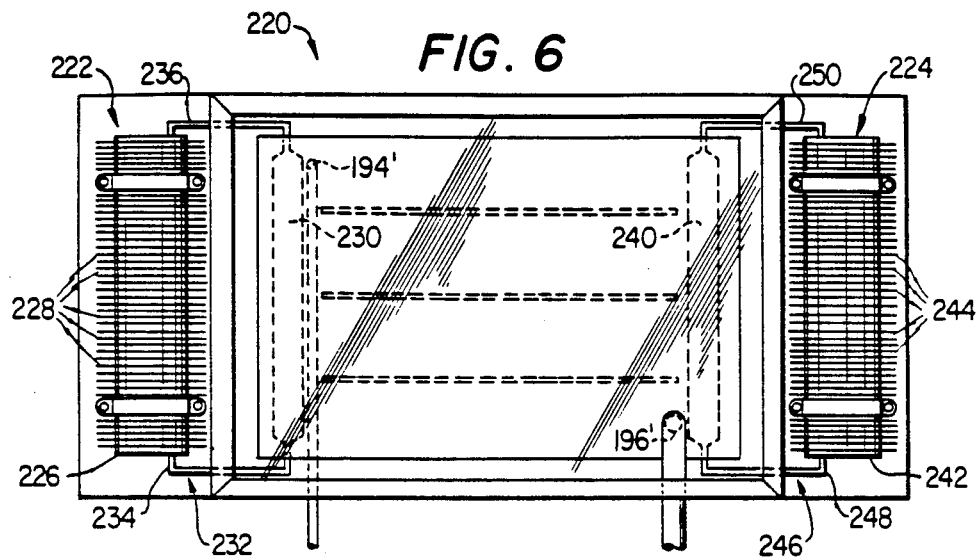
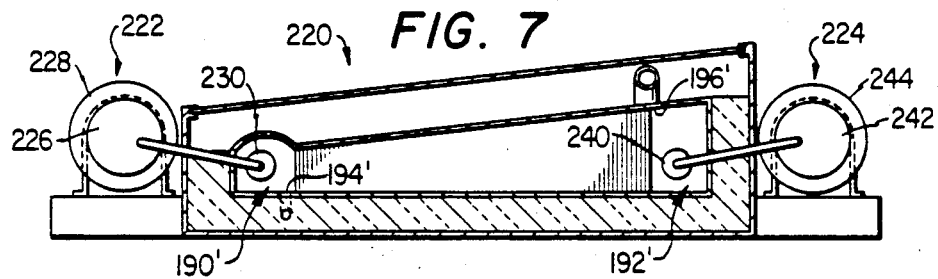
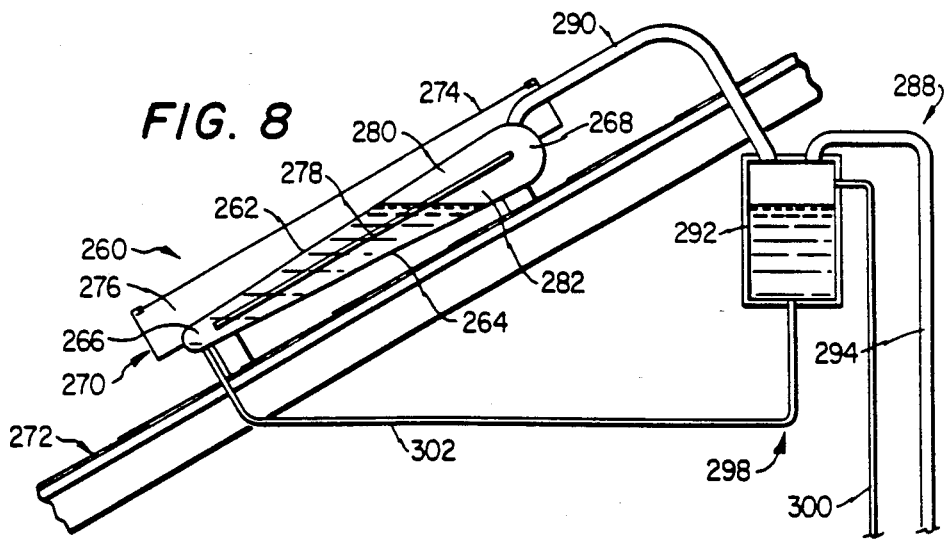

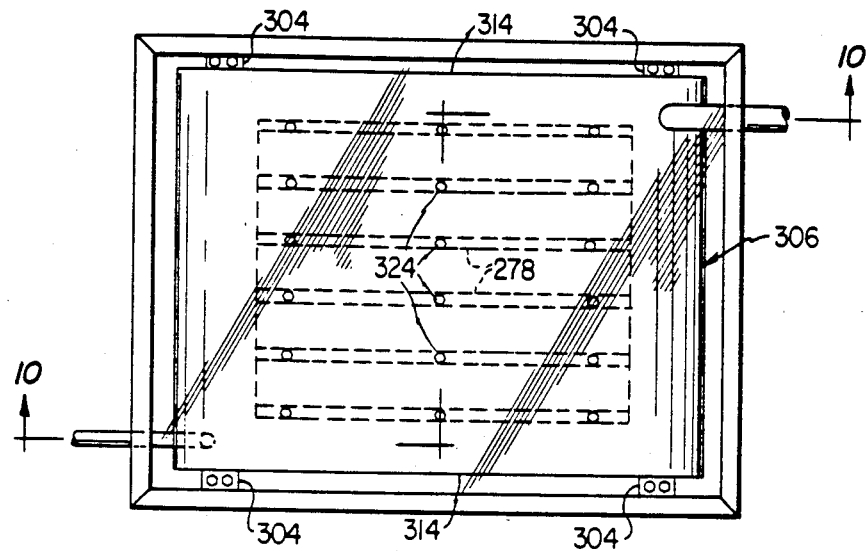
FIG. 9
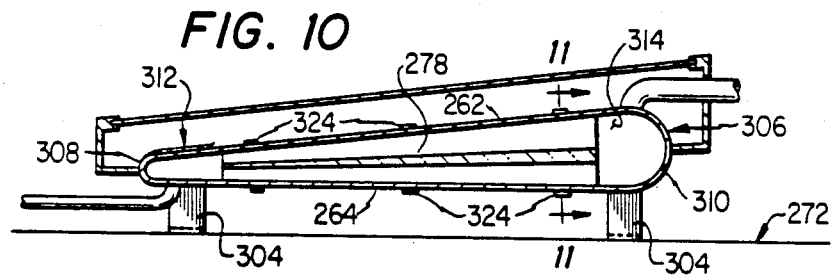
FIG. 10
FIG. 11

FLUID HEATING SYSTEM UTILIZING SOLAR ENERGY AND WASTE HEAT

CROSS-REFERENCE TO RELATED APPLICATION

This application is a continuation-in-part of earlier filed, copending application Ser. No. 466,359 filed Feb. 14, 1983, by Otto K. Wetzel, Jr. for SOLAR POWERED FLUID HEATING SYSTEM.

TECHNICAL FIELD

This invention relates generally to fluid heating systems, and more particularly to a system for heating water which is actuated by solar energy and waste heat.

BACKGROUND AND SUMMARY OF THE INVENTION

The use of sunlight as a heat source is an obvious way to reduce dependency on energy sources such as gas, oil, coal, etc. The solar heating of water is particularly attractive because energy available at one time may be stored for use at a later time. Because energy storage is so convenient, the use of solar energy to heat water is compatible both with the diurnal cycle of the sun and with the intermittent reduction in the availability of sunlight due to clouds.

Another advantage inherent in the use of sunlight to heat water involves the fact that the water need not be heated to high temperatures. Typically, the operating temperature range for a residential or commercial water heating system is between about 130° and about 150° F. Such a temperature range results in relatively high efficiency, and for this reason solar powered water heating systems do not require the use of highly sophisticated thermal collectors.

Realizing the foregoing advantages, numerous attempts have been made heretofore to provide a commercially practical solar powered water heating system. However, none of the prior art systems have achieved real success in the marketplace. Perhaps one reason for this lack of success involves the fact that many of the prior solar powered water heating systems have been unduly complicated. Certainly a major factor in the lack of consumer acceptance of solar powered water heating systems relates to high initial cost. It has been shown that the typical homeowner will not purchase any energy saving device unless it can be demonstrated that the device will pay for itself in energy savings within about three to four years.

The present invention comprises a solar powered fluid heating system which overcomes the foregoing and other disadvantage long since associated with the prior art to provide a system that is uncomplicated in design and therefore low both in initial cost and in maintenance costs, and which is readily adapted to effect energy savings of sufficient magnitude to return the initial cost in a minimum period of time. In accordance with the broader aspects of the invention, a solar powered fluid heating system comprises a quantity of refrigerant, a thermal collector for heating and thereby at least partially vaporizing the refrigerant, a separator for separating the vapor component from any liquid component of the heated refrigerant, and a condenser for receiving the vapor component of the heated refrigerant and for transferring heat therefrom to a fluid to be heated. A vapor conduit preferably extends from the thermal collector to the separator and from the separator to the condenser, and a liquid conduit preferably extends from the condenser to the separator and from the separator to the thermal collector. The thermal collector, separator, condenser, vapor conduit, and liquid conduit define a closed refrigerant circuit which contains the refrigerant, and refrigerant pressurizing apparatus is employed to cause the refrigerant to flow through the closed refrigerant circuit. The refrigerant pressurizing apparatus is preferably driven by solar energy, either by means of a plurality of photovoltaic cells or by means of a generator driven by a turbine which is in turn driven by vaporized refrigerant flowing through the vapor conduit from the separator to the condenser. Wind energy may also be used to provide operating power for the refrigerant pressurizing apparatus, either alone or in combination with a solar powered energy source.

In accordance with more specific aspects of the invention, the refrigerant pressurizing apparatus may comprise a pump which receives liquid refrigerant from the condenser and which directs pressurized liquid refrigerant through a portion of the liquid conduit to the separator. Alternatively, the refrigerant pressurizing apparatus may comprise a compressor which receives vaporized refrigerant from the separator and which directs pressurized refrigerant vapor through a portion of the vapor conduit to the condenser. When a compressor is utilized as the refrigerant pressurizing apparatus, a check valve is preferably provided at the outlet of the condenser to prevent refrigerant vapor from entering the liquid conduit. Such a check valve mmay comprise a chamber for receiving refrigerant flowing from the condenser into the liquid conduit, a ball positioned within the chamber and having a density greater than that of refrigerant vapor and less than that of refrigerant liquid, structure for limiting upward movement of the ball in the chamber when the chamber is filled with refrigerant liquid, and a seat for receiving the ball and thereby preventing the flow of refrigerant out of the chamber when the chamber is filled with refrigerant vapor.

In accordance with other aspects of the invention, the thermal collector preferably comprises first and second flat plates which are spaced apart to define a refrigerant heating chamber therebetween. The first and second plates preferably extend in divergent planes to define a refrigerant receiving zone wherein the plates are spaced relatively close to one another and a refrigerant discharge zone wherein the plates are positioned relatively apart from one another. One or more struts may be mounted within the refrigerant heating zone to prevent both inward and outward movement of the plates relative to each other.

A third plate formed from a thermally insulative material may be mounted within the refrigerant heating zone between the first and second plates. The third plate separates the refrigerant heating zone to an upper refrigerant path extending adjacent the first plate and a lower refrigerant path extending adjacent the second plate. In such instances the first plate is positioned for exposure to sunlight so that refrigerant in the upper refrigerant path is adapted for solar heating. The second plate is exposed to the ambient atmosphere so that refrigerant in the lower refrigerant path is adapted for heating by heat transfer from the atmosphere.

In accordance with yet another aspect of the invention, a secondary refrigerant circuit may be utilized to preheat the refrigerant within the thermal collector. In such instances an evaporator is positioned for exposure to the ambient atmosphere and a condenser is positioned within the refrigerant receiving zone of the thermal collector. The refrigerant in the secondary refrigerant circuit has a substantially lower boiling point than the refrigerant in the primary refrigerant circuit so that even at low temperatures when the sun is not shining, heat is removed from the atmosphere and transferred to the refrigerant in the thermal collector.

A similar secondary refrigerant circuit may be utilized to remove excess heat from the thermal collector during periods when the solar powered water heating system is stagnated. In such instances an evaporator is positioned within the refrigerant discharge zone of the thermal collector and a condenser is positioned for contact with the ambient atmosphere. The refrigerant in the secondary refrigerant circuit has a substantially higher boiling point than the refrigerant utilized in the solar powered fluid heating system. Thus, whenever the temperature of the refrigerant in the thermal collector exceeds the boiling point of the refrigerant in the secondary refrigerant circuit the condenser of the secondary refrigerant circuit is effective to transfer excess heat from the thermal collector to the ambient atmosphere.

Another important aspect of the invention involves the positioning of thermal collector panels, and in those instances in which they are employed, the positioning of photovoltaic cell panels, for maximum exposure to solar radiation throughout the entire day. Preferably, the panels are mounted in an inverted T-shaped array. In this manner erect panels are positioned for maximum exposure to sunlight at dawn and at dusk, prone panels are positioned for maximum exposure to sunlight at mid-day, and combinations of panels are positioned for maximum exposure to sunlight at intermediate hours of the day. The outputs of all of the panels are added to provide a combined output which is optimized throughout all of the daylight hours.

Still another important feature of the invention relates to the use thereof in high latitudes, i.e., above the Arctic Circle and below the Antarctic Circle, and in other applications that are characterized by little or no sunlight for substantial periods of time. In such instances the fluid heating system of the present invention may be actuated by waste heat. That is, heat from sources such as engine exhausts, engine cooling systems, building exhausts, etc., that would otherwise be dissipated into the atmosphere may instead be utilized in systems incorporating the present invention to heat fluids such as water.

DESCRIPTION OF THE DRAWINGS

A more complete understanding of the invention may be had by reference to the following Detailed Description when taken in conjunction with the accompanying Drawings, wherein:

FIG. 2a is an enlargement of a portion of the solar powered fluid heating system of FIG. 2;

FIG. 6 is a top view of a thermal collector assembly which may be utilized in any of the embodiments of the invention illustrated in FIGS. 1, 2 or 3;

FIG. 7 is an end view of the thermal collector assembly of FIG. 6 in which certain parts have been broken away more clearly to illustrate certain features of the invention;

FIG. 8 is a diagrammatic illustration of a thermal collector assembly which may be utilized in the practice of the invention;

FIG. 9 is a top view of the thermal collector assembly of FIG. 8;

FIG. 10 is a sectional view taken along the line 10—10 in FIG. 9 in the direction of the arrows;

FIG. 11 is an enlarged sectional view taken along the line 11—11 in FIG. 10 in the direction of the arrows;

DETAILED DESCRIPTION

Figure 1:
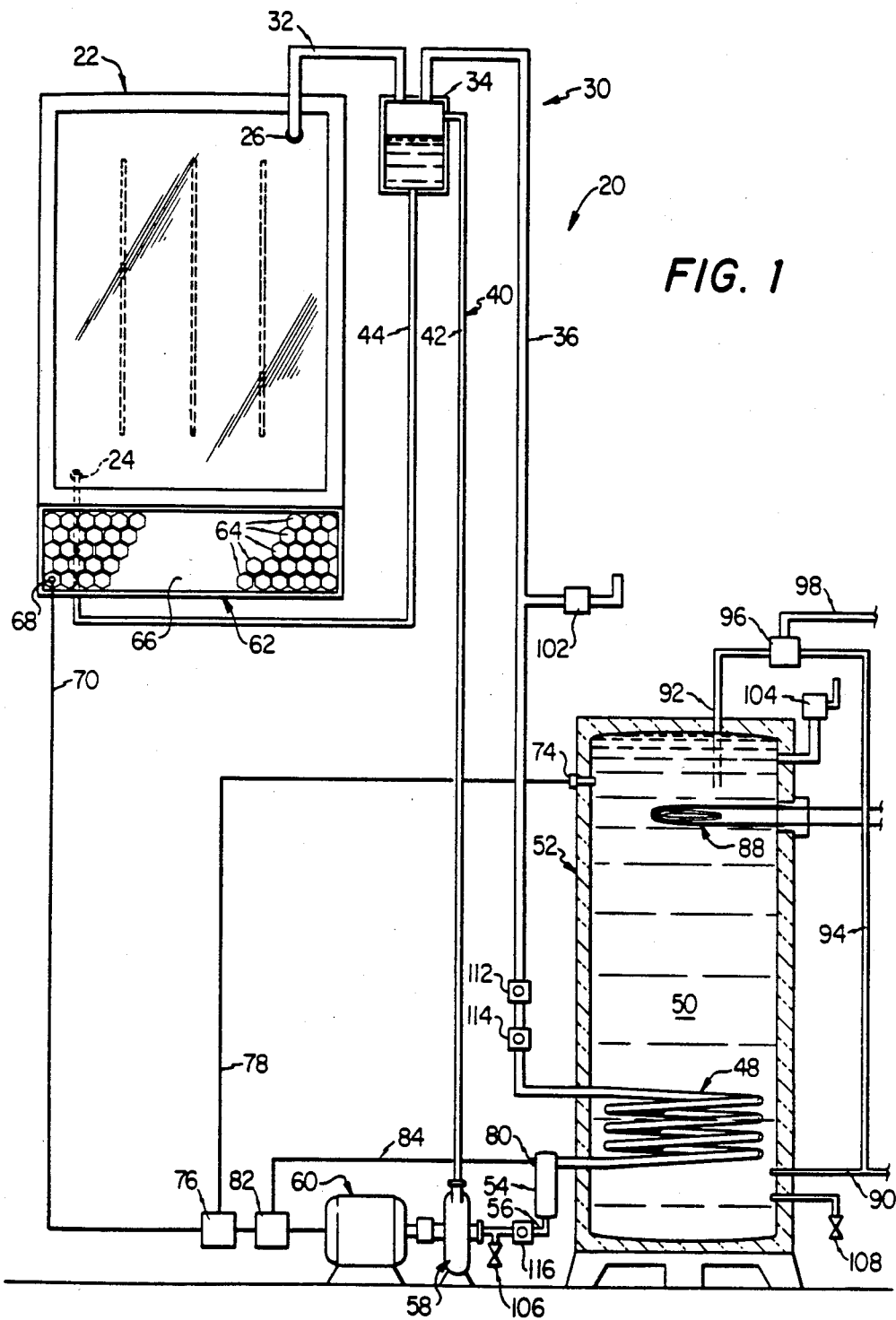
FIG. 1 is a diagrammatic illustration of a solar powered fluid heating system incorporating a first embodiment of the invention.

Referring now to the Drawings, and particularly to FIG. 1 thereof, there is shown a solar powered fluid heating system 20 incorporating a first embodiment of the invention. The system 20 is of the type that utilizes a refrigerant as the heat transfer medium. For example, refrigerants of the type known as "FREON" may be utilized in the practice of the invention.

The system 20 includes a thermal collector 22 having a inlet 24 and an outlet 26. In use, the thermal collector 22 is positioned to receive solar radiation. The thermal collector 22 functions to heat the refrigerant flowing therethrough. The particular refrigerant utilized in the system 20 is selected, and the thermal collector 22 is designed such that the refrigerant is received through the inlet 24 of the thermal collector 22 in the liquid phase and is at least partially vaporized before flowing out of the thermal collector 22 through the outlet 26.

A vapor conduit 30 includes a first portion 32 extending from the outlet 26 of the thermal collector 22 to a separator 34. The separator 34 is illustrated in the drawings as a separate vessel, but may in fact comprise part of the structure of the thermal collector 22, if desired. The separator 34 receives heated refrigerant from the thermal collector 22 and functions to separate the vapor component of the heated refrigerant from any liquid component thereof. The vapor component of the heated refrigerant flows out of the separator 34 through a second portion 36 of the vapor conduit 30.

A liquid conduit 40 includes a first portion 42 comprising an inlet to the separator 34 and a second portion 44 comprising an outlet therefrom. If the heated refrigerant flowing out of the thermal collector 22 has a liquid component, such liquid component does not flow out of the separator 34 through the second portion 36 of the vapor conduit 30. Instead, any liquid component of the heated refrigerant flows through the separator 34 and through the second portion 44 of the liquid conduit 40 and is returned thereby to the thermal collector 22 through the inlet 24.

The vapor component of the heated refrigerant flows through the second portion 36 of the vapor conduit 30 to a condenser 48. The condenser 48 is located in a quantity of water 50 which is in turn contained by a tank 52. The condenser 48 transfers heat from the refrigerant to the quantity of water 50 and in so doing returns the refrigerant from the vapor phase to the liquid phase. Liquid refrigerant flows out of the condenser 48 into an accumulator 54, and out of the accumulator 54 through a third portion 56 of the liquid conduit 40 to a pump 58.

The pump 58 is driven by a motor 60. The pump 58 functions to receive liquid refrigerant from the condenser 48 through the accumulator 54 and to direct pressurized liquid refrigerant through the first portion 42 of the liquid conduit 40. Liquid refrigerant flowing through the first portion 42 of the liquid conduit 40 enters the separator 34 and is then returned to the thermal collector 22 through the second portion 44 of the liquid conduit 40 and the inlet 24 of the thermal collector 22.

It will thus be understood that the thermal collector 22, the separator 34, the condenser 48 including the accumulator 54, the vapor conduit 30 and the liquid conduit 40 comprise a closed refrigerant circuit having a predetermined quantity of refrigerant therein. The function of the refrigerant is to receive energy by means of the thermal acuumulator 22 and to transfer the received energy to the quantity of water 50 by means of the condenser 48. The function of the pump 58 is to effect the flow of refrigerant through the closed refrigerant circuit.

The solar powered fluid heating system 20 further comprises a photovoltaic collector 62. The photovoltaic collector 62 comprises a plurality of photovoltaic cells 64 which are mounted in a panel 66. The function of the photovoltaic collector 62 is to receive solar energy and to produce an electrical output in response thereto. The photovoltaic collector 62 has an output terminal 68 which is connected to the motor 60 through a line 70. An external power source may be used to actuate the motor 60 in lieu of the photovoltaic collector 62, if desired.

A temperature sensor 74 is mounted in the tank 52 and extends into contact with the quantity of water 50 contained therein. The temperature sensor 74 is connected to a switch 76 through a line 78. Whenever the temperature of the quantity of water 50 in the tank 52 exceeds a preset limit, the temperature sensor 74 actuates the switch 76 to discontinue the flow of electrical energy from the photovoltaic collector 62 to the motor 60.

A float switch 80 is mounted in the accumulator 54. The float switch 80 is connected to a switch 82 through a line 84. The float switch 80 actuates the switch 82 to discontinue the flow of electrical energy from the photovoltaic collector 62 to the motor 60 whenever the liquid refrigerant in the accumulator 54 falls below a predetermined level.

The tank 52 is preferably conventional in design and construction. The tank 52 is preferably either formed from or is surrounded by a thermally insulating material to prevent the loss of heat from the quantity of water 50 contained within the tank 52. The tank 52 is provided with an auxiliary heating apparatus 88 which functions to heat the quantity of water 50 whenever other energy is unavailable for such purpose. It will be understood that although an electrical auxiliary heating apparatus 80 is illustrated in FIG. 1, the auxiliary heating apparatus 88 is entirely conventional in design and may be adapted for actuation by any convenient type of fuel.

Cold water is received in the tank 52 through an inlet line 90. Hot water is withdrawn from the tank 52 through a line 92. The line 92 and a line 94 connected to the inlet line 90 both extend to a blending valve 96. The blending valve 96 combines hot water from the line 92 and cold water from the line 94 in proper proportions to prevent delivery of water at a desired temperature above a predetermined maximum through an outlet line 98.

The closed refrigerant circuit includes a relief valve 102, and the tank 52 is provided with a relief valve 104. The closed refrigerant circuit further includes a drain valve 106, and the tank has a drain valve 108. The function of the relief valves 102 and 104 is to automatically release excess pressure from the refrigerant circuit and from the tank 52, respectively, and the function of the drain valves 106 and 108 is to facilitate the removal of refrigerant from the refrigerant circuit and water from the tank 52, respectively.

The closed refrigerant circuit of the solar powered fluid heating system 20 further includes a pair of upper sight glasses 112 and 114 forming part of the second portion 36 of the vapor conduit 30 and a lower sight glass 116 forming part of the third portion 56 of the liquid conduit 40. The function of the sight glasses 112, 114 and 116 is to facilitate the filling of the closed refrigerant circuit with refrigerant. In each instance air is first purged from the refrigerant circuit in the conventional manner.

Assume first that the temperature of the thermal collector 22 is higher than that of the quantity of water 50 in the tank 52. In such a case the upper sight glasses 112 and 114 are used to determine the proper refrigerant level. Refrigerant is added to the circuit until it is observable in the sight glass 114 but is not observable in the sight glass 112. This assures that the proper quantity of the refrigerant has been added to the circuit.

Assume now that the temperature of the quantity of water 50 in the tank 52 is higher than the temperature of the thermal collector 22. In such cases the sight glass 116 is utilized to determine the proper refrigerant level. Refrigerant is added to the system until it is observable in the sight glass 116. This assures that a proper quantity of refrigerant has been added to the circuit.

The operation of the solar powered fluid heating system 20 will be readily understood upon consideration of three different operating conditions. Assume first that the sun is shining and that hot water is being used. Refrigerant is heated in the thermal collector 22, and heated refrigerant flows out of the thermal collector 22 through the outlet 26 and the first portion 32 of the vapor conduit to the separator 34. In the separator 34 the vapor component of the heated refrigerant is separated from any liquid component thereof, and the vapor component of the heated refrigerant then flows through the second portion 36 of the vapor conduit 30 to the condenser 48.

In the condenser 48 heat is transferred from the refrigerant to the quantity of water 50 in the tank 52, and the refrigerant is simultaneously returned from the vapor phase to the liquid phase. Liquid refrigerant flows out of condenser 48 through the accumulator 54 and through the third portion 56 of the liquid conduit 40 to the pump 58.

The pump 58 is driven by the motor 60 and functions to direct pressurized liquid refrigerant through the first portion 42 of the liquid conduit 40 to the separator 34. Liquid refrigerant received in the separator 34, either through the first portion 32 of the vapor conduit 30 or through the first portion 42 of the liquid conduit 40, is withdrawn from the separator 34 through the second portion 44 of the liquid conduit 30 and is directed to the thermal collector 22 through the inlet 24. At this point the foregoing cycle of operation is repeated and is thus continuous in nature.

The pump 58 is driven by the motor 60 which is in turn driven by electrical energy supplied either from the photovoltaic collector 62 through the line 70 or from an external source. If the temperature of the quantity of water 50 in the tank 52 exceeds a pedetermined limit, the temperature sensor 74 actuates the switch 76 to interrupt the flow of electrical energy to the motor 70 and operation of the system 20 ceases. Likewise, if the accumulator 54 is not full of liquid refrigerant the float switch 80 actuates the switch 82 to interrupt the flow of electrical energy to the motor 60 and operation of the system 20 ceases.

Assume now that the sun is shining but that no hot water is being used. The foregoing cycle of operation continues until the temperature of the quantity of water 50 in the tank 52 reaches a predetermined upper limit. At this point the temperature sensor 74 actuates the switch 76 to interrupt the flow of electrical energy to the motor 60. Thereafter, liquid refrigerant is no longer returned to the separator 34 by the pump 58.

The thermal collector 22 temporarily continues to generate heated refrigerant. The vapor component of the heated refrigerant continues to flow to the condenser 48 through the second portion 36 of the vapor conduit 30. However, liquid refrigerant is not returned from the condenser 48 to the separator 34, but instead accumulates in the condenser 48, in the accumulator 54, in the third portion 56 of the liquid conduit 40 and in the lower part of the first portion 42 of the liquid conduit 40.

Eventually all of the refrigerant is exhausted from the separator 34 and from the thermal collector 22. Therefore, although the system 20 is in the so-called stagnation condition, the system 20 cannot reach excessive temperature or pressure levels. This is because all of the refrigerant is exhausted from the thermal collector 22, whereupon further heating thereof cannot take place. The system 20 simply remains in the stagnation condition until the temperature of the quantity of water 50 in the tank 52 is reduced, whereupon the operating cycle of the system 20 is automatically restarted.

Assume now that hot water is being withdrawn from the tank 52 but that the sun is not shining. In such instances the system 20 does not operate. The refrigerant in the closed refrigerant circuit then accumulates either in the thermal collector 22 and the separator 34, if the temperature of the quantity of water in the tank 52 is higher than the temperature of the thermal collector 22, or in the condenser 48, the third portion 56 of the liquid conduit 40 and the lower part of the first portion 42 of the liquid conduit 40, if the temperature of the thermal collector is higher than that of the quantity of water 50 in the tank 52. In either event the system 20 quickly comes to equilibrium, and any significant flow of refrigerant through the closed refrigerant circuit is discontinued.

The fact that the sun is not shining when there is a demand for hot water does not mean that hot water is unavailable from the tank 52. To the contrary, in such circumstances the auxiliary heating apparatus 88 is automatically actuated to heat the quantity of water 50 in the tank to a predetermined temperature range. When the auxiliary heating apparatus 88 is operating, the tank 52 functions in the manner of a conventional water heater.

It will thus be understood that the solar powered fluid heating system 20 comprises a virtually fail safe system for providing hot water. Under normal operating conditions the system 20 operates continuously to heat the quantity of water 50 within the tank 52. If the sun is shining but no hot water is being used the system 20 eventually discontinues operation, but under circumstances not involving any danger of excessive temperature or pressure levels. If the sun is not shining and hot water is being used the auxiliary heating system 88 automatically functions to maintain the quantity of water 50 within the tank 52 within a predetermined temperature range.

Figure 2:
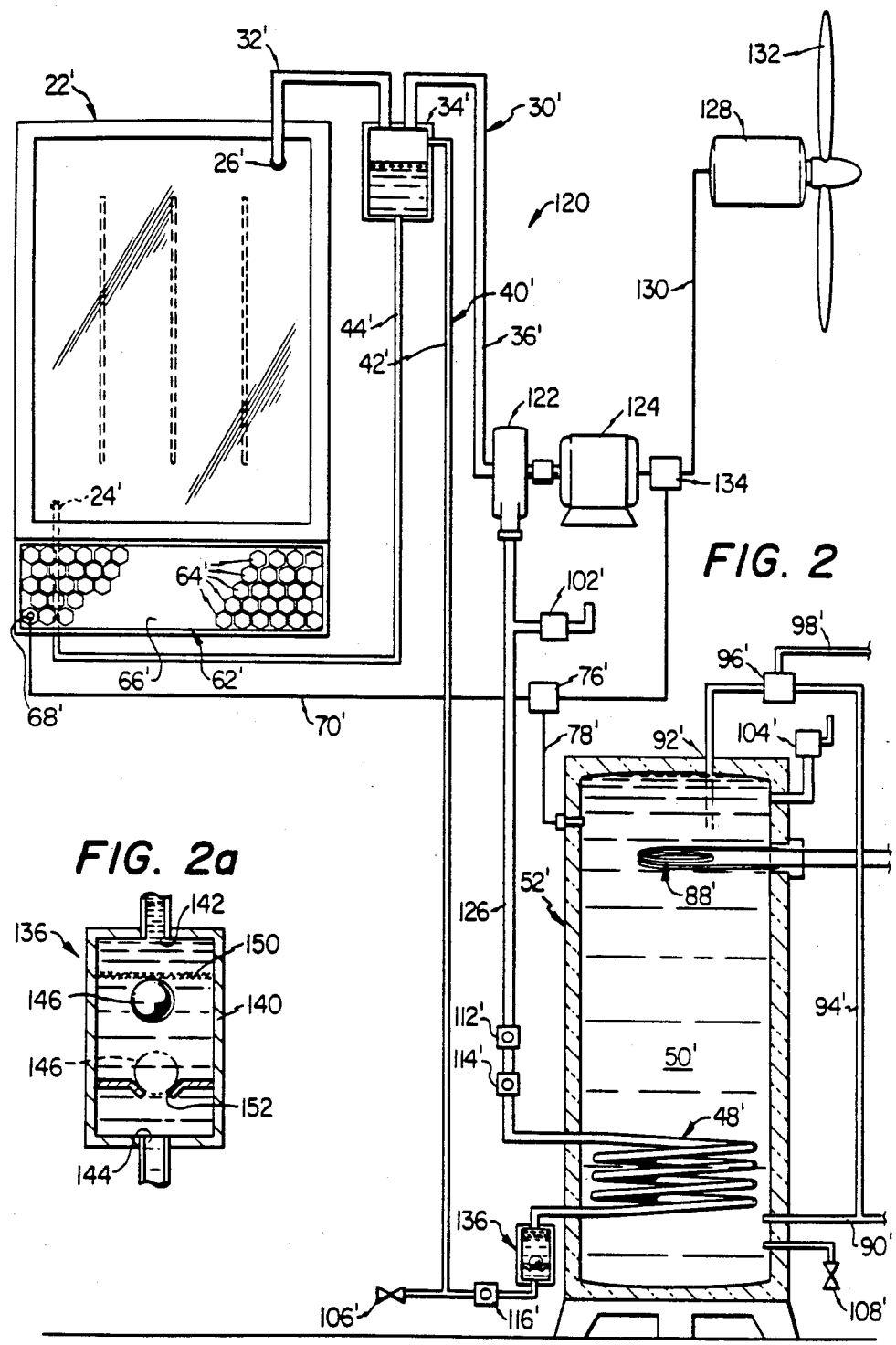
FIG. 2 is an illustration similar to FIG. 1 showing a second embodiment of the invention.

Referring now to FIG. 2, there is shown a solar powered fluid heating system 120 incorporating a second embodiment of the invention. The system 120 utilizes numerous component parts which are substantially identical in construction and function to component parts of the solar powered fluid heating system 20 illustrated in FIG. 1. Such identical component parts are designated in FIG. 2 with the same reference numerals utilized in the description of the system 20, but are differentiated therefrom by means of a prime (') designation.

The primary distinction between the solar powered fluid heating system 120 of FIG. 2 and the system 20 of FIG. 1 involves the fact that in lieu of the pump 58 and the motor 60 of the system 20, the system 120 employs a compressor 122 driven by a motor 124. Compressor 122 receives heated refrigerant vapor from the separator 34' through the second portion 36' of the vapor conduit 30' and directs pressurized refrigerant vapor to the condenser 48' through a third portion 126 of the vapor conduit 30'.

The motor 124 and therefore the compressor 122 are driven by electrical energy supplied from the photovoltaic collector 62'. Alternatively, the motor 124 and therefore the compressor 122 are driven by electrical energy supplied from a generator 128 through a line 130. The generator 128 is in turn driven by a windmill 132. A switch 134 prevents the backflow of electrical energy from the generator 128 to the photovoltaic collector 62' through the line 70'. The motor 124 and therefore the compressor 122 may be driven by electrical energy supplied from an external source, if desired.

Another distinction between the solar powered fluid heating system 120 of FIG. 2 and the system 20 of FIG. 1 involves the use of a check valve assembly 136 to prevent the flow of refrigerant in the vapor phase into the first portion 42' of the liquid conduit 40'. As is best shown in FIG. 2a, the check valve assembly 136 includes a chamber 140 which receives refrigerant from the condenser 48' through an inlet 142 and which discharges refrigerant into the first portion 42' of the liquid conduit 40' through an outlet 144. A ball 146 is mounted within the chamber 140.

The ball 146 has a predetermined density which is substantially less than that of the refrigerant in the closed refrigerant circuit of the system 120 when the refrigerant is in the liquid phase and is substantially greater than that of the refrigerant in the closed refrigerant circuit when the refrigerant is in the vapor phase. A screen 150 extends across the chamber 140 to limit upward movement of the ball 146 when the chamber 140 is filled with liquid refrigerant. A valve seat 152 is positioned to receive the ball 146 as liquid refrigerant is drained from the chamber 140.

It will be understood that in the normal operation of the system 120 the chamber 140 is continuously filled with liquid refrigerant. The ball 146 therefore normally floats upwardly in the chamber 140 with the upward movement of the ball 146 being limited by the screen 150. If for any reason liquid refrigerant is drained out of the chamber 140 the ball 146 moves downwardly into engagement with the valve seat 152. The ball 146 and the valve seat 152 thereafter cooperate to prevent the discharge of refrigerant in the vapor phase into the liquid conduit 40' through the outlet 144.

The operation of the solar powered fluid heating system 120 is susbstantially identical to that of the solar powered fluid heating system 20. One advantage in the use of the solar powered fluid heating system 120 shown in FIG. 2 is that the system 120 is capable of operating as a heat pump. Under such circumstances the system 120 is adapted to heat the quantity of water 50' in the tank 52' even though the sun is not shining.

For eample, consider a warm, breezy summer evening. Under such circumstances windmill 132 actuates the generator 128 to produce electrical energy which in turn actuates the motor 124 to drive the compressor 122. Heat from the atmosphere vaporizes the refrigerant in the thermal collector 22'. The compressor 122 delivers the heated refrigerant vapor from the separator 34' to the condenser 48', whereby the quantity of water 50' in the tank 52' is heated even though the sun is not shining.

Figure 3:
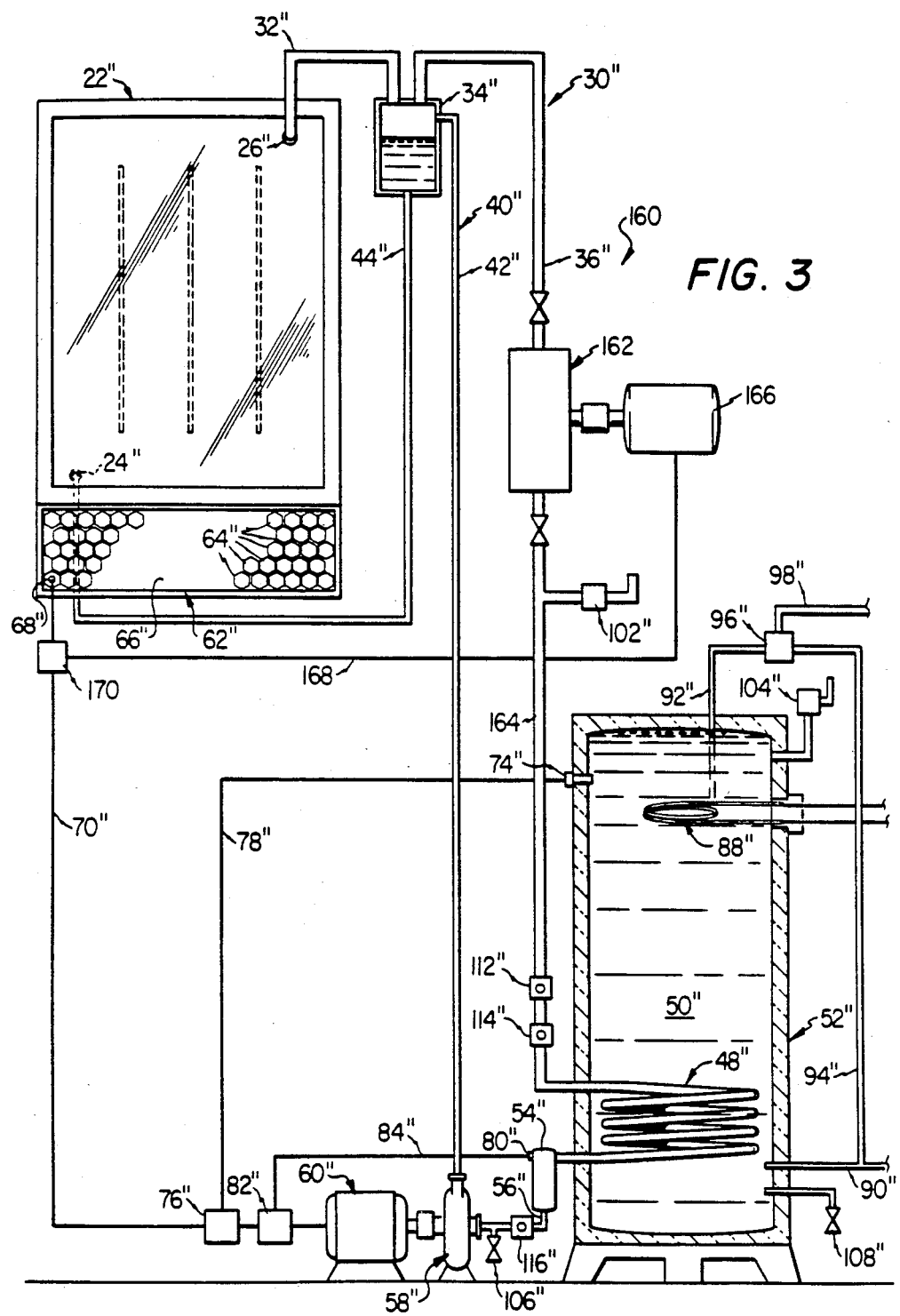
FIG. 3 is an illustration similar to FIG. 1 showing a third embodiment of the invention.

Referring now to FIG. 3, there is shown a solar powered fluid heating system 160 incorporating a third embodiment of the invention. The system 160 incorporates numerous component parts which are substantially identical in construction and function to component parts of the solar powered fluid heating system 20 shown in FIG. 1. Such identical component parts are designated in FIG. 3 with the same reference numerals utilized hereinabove in the description of the system 20, but are differentiated therefrom by means of a double prime (") designation.

The primary distinction between the solar powered fluid heating system 160 of FIG. 3 and the solar powered fluid heating system 20 of FIG. 1 relates to the fact that the system 160 includes a turbine 162. The turbine 162 receives heated refrigerant vapor from the separator 34" and is driven thereby. Refrigerant vapor discharged from the turbine 162 is directed to the condenser 48" through a third portion 164 at the vapor conduit 30".

Upon actuation by heated refrigerant vapor flowing through the vapor conduit 30", the turbine 162 drives a generator 166. The generator 166 produces an electrical output which is directed to the pump 60" through a line 168 and part of the line 70". A switch 170 prevents backflow of electrical energy from the generator 166 to the photovoltaic collector 62.

The primary advantage arriving from the use of the system 160 involves the fact that because the turbine 162 and the generator 166 are incorporated therein, the system 160 may employ a larger thermal collector and a smaller photovoltaic collector when compared with the equivalent components of the system 20. During the initial phase of the operation of the system 160, electrical energy for driving the motor 60" and therefore the pump 58" is supplied from the photovoltaic collector 62". However, when the system 160 is in full operation the thermal collector 22" supplies refrigerant vapor in sufficient quantity both to operate the turbine 162 and to heat the quantity of water 50" in the tank 52" by means of the condenser 48". Under such circumstances electrical energy for driving the pump 58" is primarily supplied by the generator 166 under the actuation of the turbine 162. Otherwise, the operation of the system 160 is substantially identical to that of the system 120.

Figure 4:
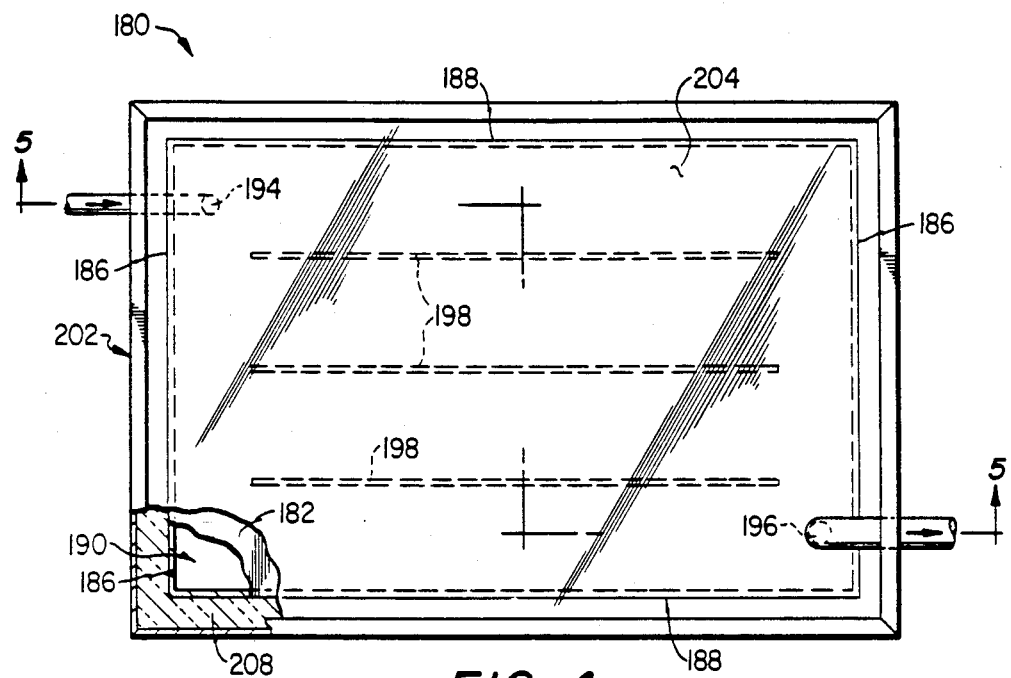
FIG. 4 is a top view of a thermal collector which may be utilized in any of the embodiments of the invention shown in FIGS. 1, 2 or 3.
Figure 5:
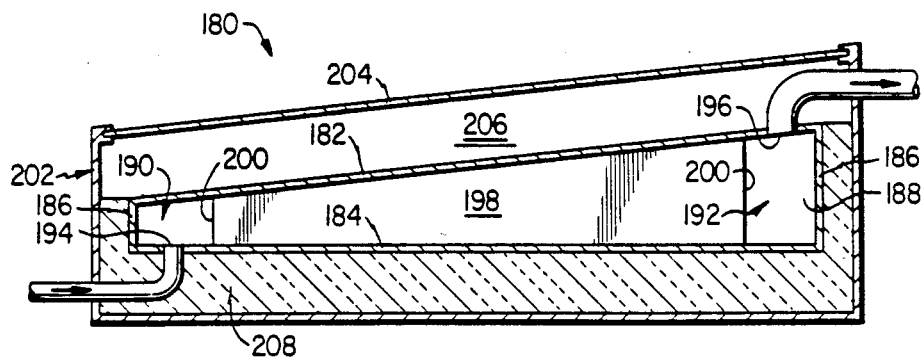
FIG. 5 is a sectional view taken along the line 5—5 in FIG. 4.

Referring now to FIGS. 4 and 5, there is shown a thermal collector assembly 180 which may be utilized in any of the solar powered fluid heating systems 20, 120 or 160 illustrated in FIGS. 1, 2 and 3, respectively. The thermal collector assembly 180 includes first and second plates 182 and 184 which are preferably formed from metal. Although illustrated as flat in FIGS. 4 and 5, plates 182 and 184 may be strengthened by various means, if desired. In any event at least the first plate 182 must be formed from a material which is highly thermally conductive. The outer surface of the first plate 182 is preferably finished utilizing conventional techniques in such a way as to be highly absorbent of and therefore highly nonreflective of solar radiation.

A pair of end walls 186 and a pair of side walls 188 extend along the ends and sides of the first and second plates 182 and 184, respectively. The end walls 186 and the side walls 188 are secured to the plates 182 and 184 for cooperation therewith to define a substantially closed refrigerant heating chamber. The first and second plates 182 and 184 extend in divergent planes to define a refrigerant receiving zone 190 wherein the plates 182 and 184 are positioned relatively close to one another, and a refrigerant discharge zone 192 wherein the plates 182 and 184 are positioned relatively apart from one another. A refrigerant inlet 194 extends to the refrigerant receiving zone 190 of the refrigerant heating chamber, and a refrigerant outlet 196 extends from the refrigerant discharge zone 192 of the refrigerant heating chamber.

A plurality of struts 198 are positioned within the refrigerant heating zone of the thermal collector assembly 180. Each strut 198 is connected between the first and second plates 182 and 184 and serves to prevent both inward and outward movement of the plates relative to each other. The struts 198 extend generally parallel to and are spaced apart from the side walls 188. The struts extend to ends 200 which are spaced apart from the end walls 186. The size, shape and positioning of the struts 198 relative to the side walls 188 and the end walls 186 are selected so as to not impede the flow of refrigerant throughout the refrigerant heating chamber.

It will be noted that, except for the negligible area in which the plate 182 engages the struts 198, the entire interior surface area of the plate 182 is in contact with refrigerant contained within the refrigerant heating chamber. This feature of the thermal collector assembly 180 is highly important in that it greatly enhances the flow of solar energy into the thermal collector as compared with prior designs.

The thermal collector assembly 180 further includes a frame 202. The frame 202 includes a panel 204 overlying the first plate 182. The panel 204 is formed from a material which is highly transparent to solar radiation, for example, glass. The panel 204 and the remainder of the frame 202 define a closed chamber 206 overlying the first plate 182.

The remainder of the frame 202 may be formed from any convenient material, for example, metal, plastic, wood, etc. In certain applications of the thermal collector assembly 180 it will be desirable to thermally insulate the plate 184, the end walls 186 and the side walls 188 which cooperate with the plate 182 to define the refrigerant heating chamber. In such instances a layer of insulation 208 is provided between the frame 202 and the plate 184, the end walls 186 and the side walls 188.

In other applications of the thermal collector assembly 180 it will be desirable to expose the plate 184 to solar radiation. In such cases the portion of the frame 202 overlying the plate 184 is formed from a material such as glass and the portion of the layer of insulation 208 extending adjacent the plate 184 is omitted. In still other applications of the thermal collector assembly 180 it will be desirable to expose the plate 184 to the ambient atmosphere. In such cases the frame 202 is constructed to seal the chamber 206, the layer of insulation 208 is omitted entirely, and the frame 202 is constructed in an open configuration to allow the passage of the ambient atmosphere therethrough adjacent to the plate 184.

Referring now to FIGS. 6 and 7, there is shown a thermal collector assembly 220 which may be utilized in any of the solar powered fluid heating systems 20, 120 or 160 shown in FIGS. 1, 2 and 3, respectively. The thermal collector assembly 220 incorporates numerous component parts which are substantially identical to component parts of the thermal collector assembly 180 shown in FIGS. 4 and 5. Such identical component parts are designated in FIGS. 6 and 7 with the same reference numerals utilized hereinabove in the description of the thermal collector assembly 180, but are differentiated therefrom by means of a prime (') designation.

The thermal collector assembly 220 differs from the thermal collector 180 in that it incorporates a preheater assembly 222 and a heat dissipating assembly 224. As will be appreciated by those skilled in the art, the preheater assembly 222 may be utilized with or without the heat dissipating assembly 224, and vice versa. That is, although the preheater assembly 222 and the heat dissipating assembly 224 are illustrated in conjunction with the same thermal collector assembly 220, the two assemblies are actually entirely distinct from each other, both in construction and in function.

The preheater assembly 222 includes an evaporator 226 adapted to receive heat from the ambient atmosphere. To this end, the evaporator 226 may be provided with a plurality of fins 228. Other conventional techniques for enhancing the exposure of the evaporator 226 to the ambient atmosphere may be utilized in the practice of the invention, if desired. The assembly 222 further includes a condenser 230 positioned in the refrigerant heating chamber of the thermal collector assembly 220, and specifically in the refrigerant receiving zone 190' thereof. A refrigerant conduit 232 includes a first portion 234 extending from the evaporator 226 to the condenser 230 and a second portion 236 extending from the condenser 230 to the evaporator 226.

The preheater assembly 222 is particularly adapted for use in conjunction with embodiments of the invention such as that shown in FIG. 2 wherein a compressor is utilized to receive refrigerant vapor from the separator and to direct pressurized refrigerant vapor to the condenser. In such instances the preheater assembly 222 is preferably charged with a refrigerant having a substantially lower boiling point than the boiling point of the refrigerant in the refrigerant heating chamber of the thermal collector assembly 220. The refrigerant in the preheater assembly 222 is therefore adapted for vaporization in the evaporator 226 at temperatures substantially below the boiling point of the refrigerant in the refrigerant heating chamber of the thermal collector assembly 220, and regardless of whether or not the sun is shining.

Refrigerant vapor flows from the evaporator 226 through the refrigerant conduit 232 to the condenser 230, wherein heat is transferred from the refrigerant of the preheater assembly 222 to the refrigerant within the refrigerant heating chamber of the thermal collector assembly 220. This procedure continues until the refrigerant in the refrigerant heating chamber of the thermal collector assembly 220 has been heated sufficiently to effect vaporization thereof. The refrigerant vapor then flows through the outlet 196' of the thermal collector assembly 220 to the separator and from the separator to the compressor which in turn directs compressed refrigerant vapor to the condenser of the solar powered fluid heating system. In this manner the solar powered fluid heating system is adapted to produce hot water even at temperatures substantially below the vaporization temperature of the refrigerant in the primary refrigerant circuit thereof.

The heat dissipating assembly 224 comprises an evaporator 240 positioned within the refrigerant discharge zone 192' of the thermal collector assembly 220. A condenser 242 is adapted to discharge heat to the ambient atmosphere. To this end, the condenser 242 is provided with a plurality of heat dissipating fins 224. Other conventional techniques for maximizing heat transfer from the condenser 242 to the ambient atmosphere may be utilized in the practice of the invention, if desired. A refrigerant conduit 246 includes a first portion 248 extending from the evaporator 240 to the condenser 242 and a second portion 250 extending from the condenser 242 to the evaporator 240.

The heat dissipating assembly 224 is charged with the refrigerant having a substantially higher boiling point than the boiling point of the refrigerant in the refrigerant heating chamber of the thermal collector assembly 220. As will be appreciated, certain operating conditions of a solar powered fluid heating system can occur in which the temperature within the thermal collector assembly of the system rises significantly. In any such instance the refrigerant in the evaporator 240 is vaporized. The refrigerant vapor then flows into the condenser 242, whereupon heat is removed from the refrigerant and is discharged into the ambient atmosphere. In this manner protection against excessive temperature within the refrigerant heating chamber of the thermal collector assembly 220 is assured.

A thermal collector assembly 260 constructed in accordance with the invention is diagrammatically illustrated in FIG. 8. The thermal collector assembly 260 includes first and second plates 262 and 264 each formed from a thermally conductive material. The plates 262 and 264 may be specially fabricated for strength, if desired. The first and second plates 262 and 264 define a refrigerant heating chamber therebetween. The plates 262 and 264 extend in divergent planes to define a refrigerant receiving zone 266 wherein the plates 262 and 264 are positioned relatively close to one another and a refrigerant discharge zone 268 wherein the plates 262 and 264 are positioned relatively apart from each other.

A frame 270 supports the plates 262 and 264 and the refrigerant heating zone defined therebetween on the surface 272 of a roof. The frame 270 supports the plate 264 in a spaced apart relationship with respect to the roof surface 272. The frame 270 includes a plate 274 which is transparent to solar radiation. The plate 274 together with other components of the frame 270 form a closed chamber 276 surrounding the plate 262 of the thermal collector assembly 260.

A third plate 278 formed from a thermally insulating material is positioned within the refrigerant heating zone between the first and second plates 262 and 264. The third plate 278 is positioned substantially equidistant from the first and second plates 262 and 264, and extends the entire distance between the refrigerant receiving zone 266 and the refrigerant discharge zone 268. The third plate 278 divides the refrigerant heating chamber into an upper refrigerant path 280 extending adjacent the first plate 262 and the second refrigerant path 282 extending adjacent the second plate 264. Refrigerant in the first refrigerant path 280 is adapted for heating by solar radiation which passes through the plate 274 of the frame 270 and through the first plate 262 to heat the refrigerant in the first refrigerant path. Refrigerant in the second refrigerant path 282 is adapted to receive heat from the ambient atmosphere through the second plate 264. Thus, the thermal collector assembly 260 is adapted to produce refrigerant vapor when the sun is shining, or when the temperature of the surrounding atmosphere is sufficiently high to vaporize the refrigerant in the refrigerant heating chamber thereof, or both.

Heated refrigerant flows from the thermal collector assembly 260 through a vapor conduit 288 including a first portion 290 extending from the refrigerant discharge zone 268 of the thermal collector assembly 260 to a separator 292 and a second portion 294 extending from the separator 292 to the condenser (not shown).

Liquid refrigerant is returned to the thermal collector assembly 260 from the condenser through a liquid conduit 298 including a first portion 300 extending from the condenser to the separator 292 and a second portion 302 extending from the separator 292 to the refrigerant receiving zone 266 of the thermal collector assembly 260. It will thus be understood that the thermal collector assembly 260 is adapted for use with any of the solar powered fluid heating system 20, 120 or 160 shown in FIGS. 1, 2 and 3, respectively.

The structural details of the thermal collector assembly 260 are illustrated in FIGS. 9, 10 and 11. The frame 270 includes legs 304 which support the plate 264 above the underlying surface 272. The plates 262 and 264 may comprise part of an elongated plate 306 which is bent around a suitable form to provide curved end portions 308 and 310. The ends of the plate 306 are overlapped at a convenient location 312 and are welded or brazed together. The refrigerant heating chamber of the thermal collector assembly 260 is then closed by side plates 314 extending along and joined to the opposite edges of the plate 306.

The third plate 278 of the thermal collector assembly 260 preferably comprises part of a third plate/strut assembly 320. As is best shown in FIG. 11, in addition to the third plate portion 278, the third plate/strut assembly 320 includes a plurality of strut portions 322 each extending outwardly from the third plate portion 278 into engagement with the interior surfaces of the plates 262 and 264. The third plate/strut assembly 320 further includes a plurality of fasteners 324 each extending through the plates 262 and 264 and through one of the strut portions 322. By means of the strut portions 322 and the fasteners 324, the third plate/strut assembly 320 serves to prevent both inward and outward movement of the plates 262 and 264 relative to one another.

Figure 12:
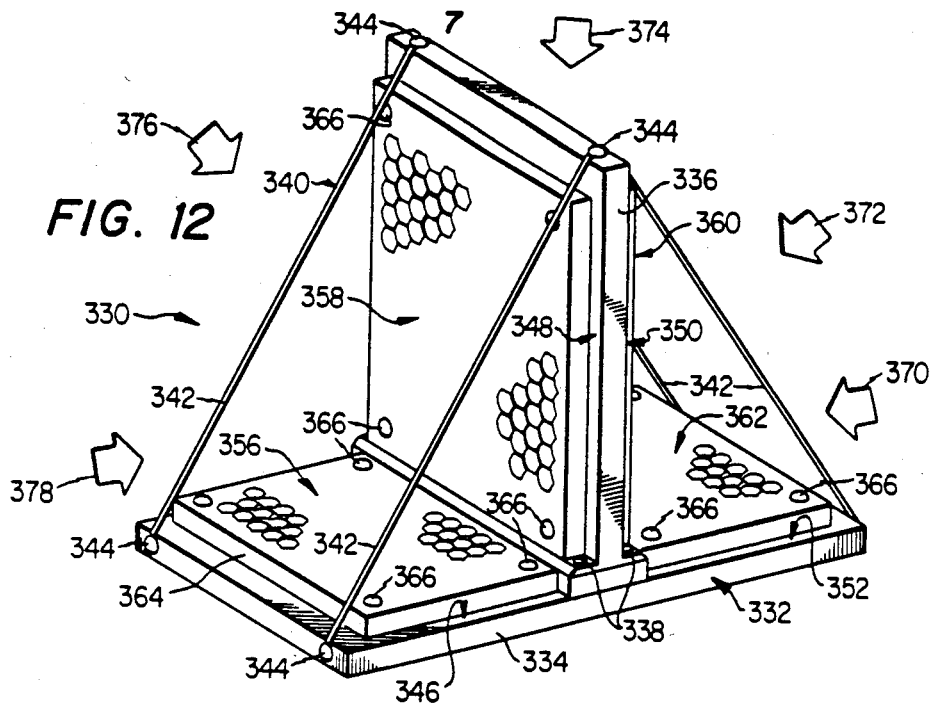
FIG. 12 is a perspective view showing a photovoltaic cell assembly which may be utilized in any of the embodiments of the invention shown in FIGS. 1, 2 or 3.

FIG. 12 illustrates a photovoltaic cell assembly 330 which may be utilized in conjunction with any of the solar powered fluid heating systems 20, 120 or 160 illustrated in FIGS. 1, 2 and 3. The photovoltaic cell assembly 330 includes a frame 332 including a prone portion 334 and an erect portion 336. The erect portion 336 is preferably secured to the prone portion 334 by means of fasteners 338 to facilitate disassembly of the frame 332 for shipping, etc. The frame 332 further includes suitable bracing structure 340 for preventing relative movement between the erect portion 336 and the prone portion 334 of the frame. For example, the bracing structure 340 may comprise cables 342 secured to suitable fasteners 344, etc.

The prone portion 334 of the frame 332 includes a first support surface 346, and the erect portion 336 of the frame includes a second support surface 348. The second support surface 348 extends perpendicularly with respect to the first support surface 346. The erect portion 336 of the frame further includes a third support surface 350 which extends parallel to but which faces in the opposite direction from the second support surface 348. The prone portion of the frame 332 further includes a fourth support surface 352 which extends parallel to, and preferably comprises an extension of the first support surface 346.

The photovoltaic cell assembly 330 further comprises a first array of photovoltaic cells 356 mounted on the first support surface 346; a second array of photovoltaic cells 358 mounted on the second support surface 348; a third array of photovoltaic cells 360 mounted on the third support surface 350 and a fourth array of photovoltaic cells 362 mounted on the fourth support surface 352. The arrays of photovoltaic cells 356, 358, 360 and 362 are each mounted in a frame 364, and the frames 364 are secured to the frame 332 by means of suitable fasteners 366. Each of the arrays of photovoltaic cells 356, 358, 360 and 362 produces an output, and the outputs of the arrays of photovoltaic cells are added together to produce a combined output which is optimized throughout the entire day.

Operation of the photovoltaic cell assembly 330 will be best understood by consideration of the positioning of the sun at various times during the day. At dawn the position of the sun relative to the assembly 330 is represented by the arrow 370. At such time the array of photovoltaic cells 360 is positioned directly in the path of the rays of the sun, while the remaining photovoltaic cell arrays in the assembly 330 are positioned substantially out of the path of the rays of the sun. At mid-morning the sun is positioned as represented by the arrow 372. At such time the photovoltaic cell arrays 360 and 362 are positioned for combined maximum exposure to the rays of the sun, while the photovoltaic cell arrays 356 and 358 are positioned substantially out of the path of the rays of the sun. At mid-day the position of the sun is represented by the arrow 374. At such time the photovoltaic cell arrays 356 and 362 are positioned for maximum exposure to the rays of the sun, while the photovoltaic cell arrays 358 and 360 are positioned substantially out of the path of the rays of the sun. At mid-afternoon the position of the sun is represented by the arrow 376. At such time the photovoltaic cell arrays 356 and 358 are positioned for combined maximum exposure to the rays of the sun, while the photovoltaic cell arrays 360 and 362 are substantially non-exposed to the rays of the sun. At dusk the position of the sun is represented by the arrow 378. At such time the photovoltaic cell array 358 is positioned for maximum exposure to the rays of the sun, while the remaining photovoltaic cell arrays are not significantly exposed thereto. It will thus be understood that by adding the outputs of the photovoltaic cell arrays 356, 358, 360 and 362 the photovoltaic cell assembly 330 produces a combined output which is optimized throughout all of the daylight hours.

Figure 13:
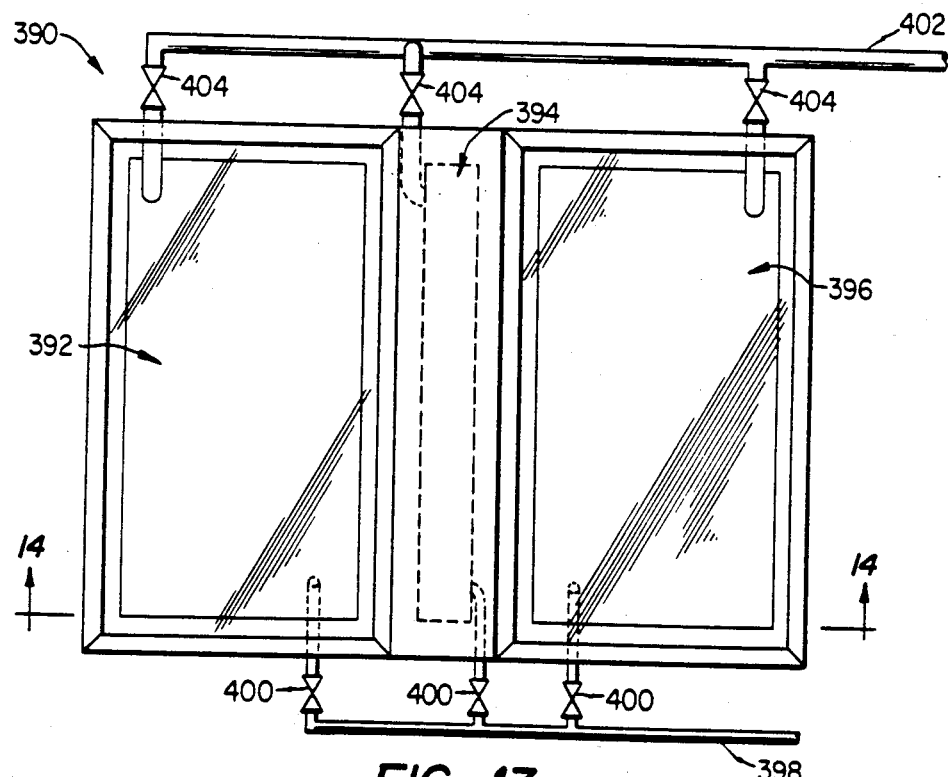
FIG. 13 is a top view of a thermal collector assembly which may be utilized in any of the embodiments of the invention shown in FIGS. 1, 2 or 3.
Figure 14:
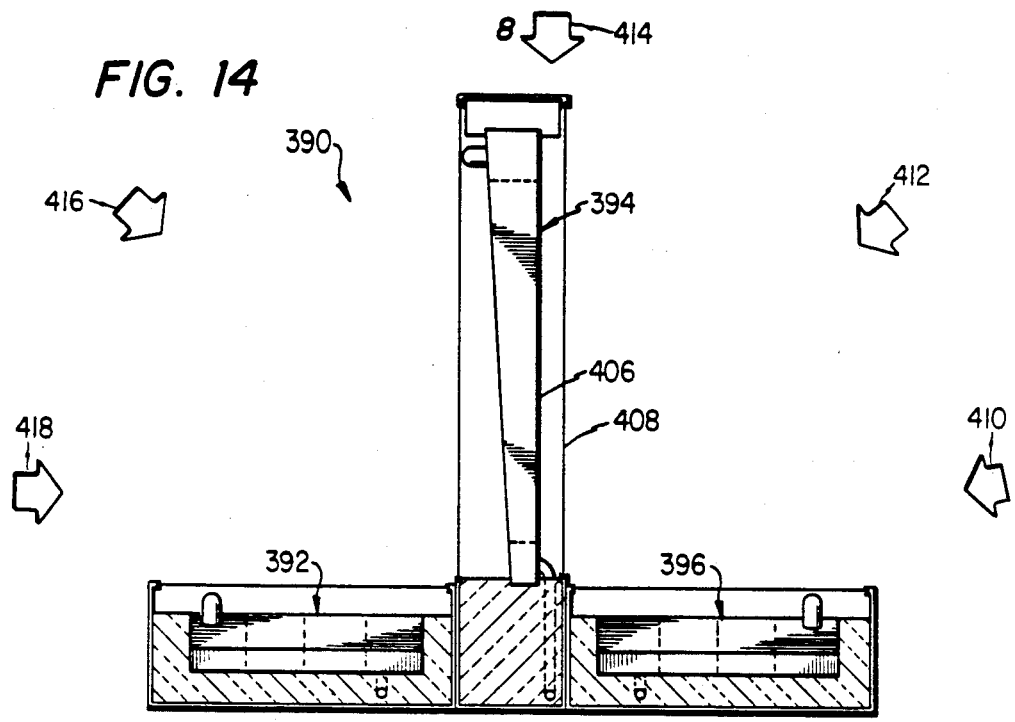
FIG. 14 is a sectional view taken along the line 14—14 in FIG. 13 in the direction of the arrows.

FIGS. 13 and 14 illustrate a thermal collector assembly 390 which may be utilized in any of the solar powered fluid heating systems 20, 120 or 160 illustrated in FIGS. 1, 2 and 3, respectively. The thermal collector assembly 390 comprises three thermal collectors 392, 394 and 396. The three thermal collectors 392, 394 and 396 receive liquid refrigerant from a common inlet conduit 398 and are connected thereto through isolation valves 400. The three thermal collectors 392, 394 and 396 discharge heated refrigerant through a common outlet conduit 402 and are connected therethrough to isolation valves 404. The use of the isolation valves 400 and 404 permits any of the thermal collectors to be disconnected from the refrigerant circuit to facilitate repair, etc.

The thermal collectors 392, 394 and 396 are preferably constructed as shown in FIGS. 4 and 5. The teachings of FIGS. 6 through 11 may also be utilized in the construction of the thermal collectors comprising the assembly 390, if desired. However, as is best shown in FIG. 14, the thermal collector 394 has a second plate 406 which is exposed to solar radiation through a panel 408 formed from a material which is transparent to solar radiation, for example, glass.

The operation of the thermal collector assembly 390 will be best understood by consideration of the position of the sun at various times during the day. At dawn, the sun is positioned as represented by the arrow 410, and the thermal collector 394 is thus positioned for maximum exposure to the rays of the sun. At mid-morning the sun is positioned as represented by the arrow 412, and the thermal collectors 394 and 396 are positioned for combined maximum exposure to the rays of the sun. At mid-day the sun is positioned as represented by the arrow 414, and the thermal collectors 392 and 396 are positioned for maximum exposure to the rays of the sun. At mid-afternoon the sun is positioned as represented by the arrow 416, and the thermal collectors 392 and 394 are positioned for combined maximum exposure to the rays of the sun. At dusk the sun is positioned as represented by the arrow 418, and the thermal collector 394 is once again positioned for maximum exposure to the rays of the sun. Since the outputs of the thermal collectors 392, 394 and 396 are added together, it will thus be understood that the thermal collector assembly 390 produces a combined output which is optimized throughout all the daylight hours.

Figure 15:
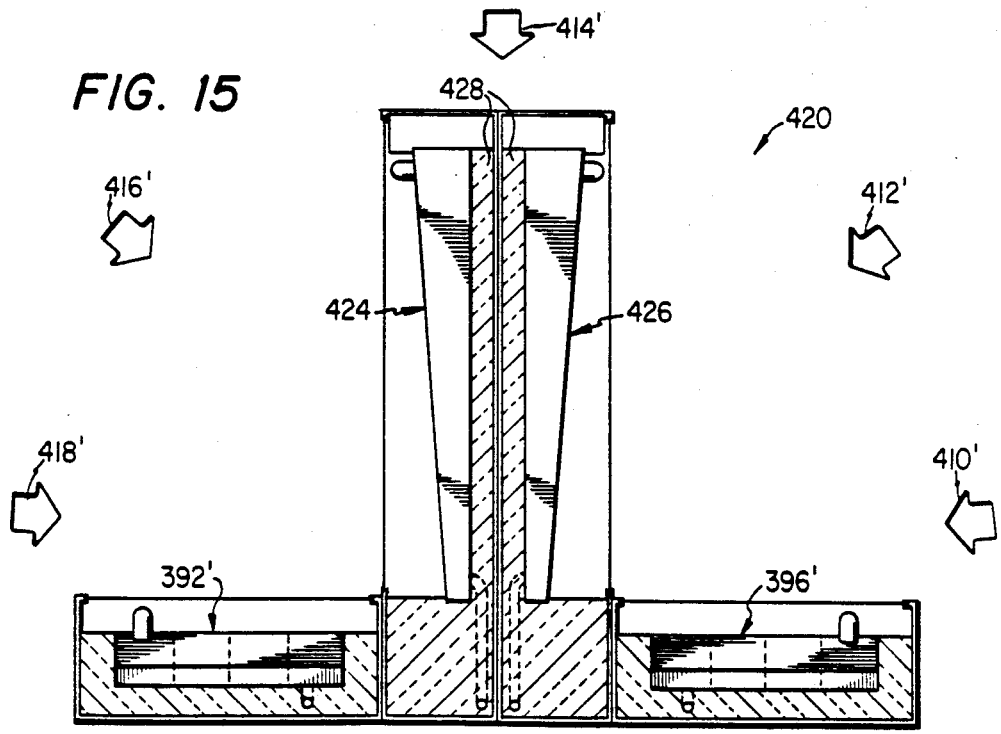
FIG. 15 is a view similar to FIG. 14 illustrating a modification of the thermal collector assembly shown therein.

FIG. 15 illustrates a thermal collector assembly 420. Many of the component parts of the thermal collector assembly 420 are substantially identical in construction and function to component parts of the thermal collector assembly 390 illustrated in FIGS. 13 and 14. Such identical component parts are identified in FIG. 15 with the same reference numerals utilized hereinabove in the description of the thermal collector assembly 390, but are differentiated therefrom by means of a prime (') designation.

The primary distinction between the thermal collector assembly 390 and thermal collector assembly 420 comprises the fact that as opposed to a single upright thermal collector 394, the thermal collector assembly 420 employs dual upright thermal collectors 424 and 426. The collectors 424 and 426 are separated by layers of thermally insulative material 428. Otherwise, the construction and operation of the thermal collector assembly 420 is identical to that described above in connection with the thermal collector assembly 390.

Figure 16:
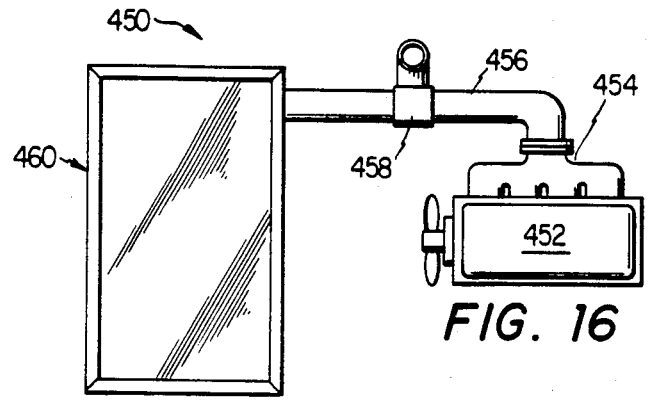
FIG. 16 is an illustration of a version of the invention that is adapted for actuation by solar energy and by waste heat extracted from the exhaust of an engine.
Figure 17:
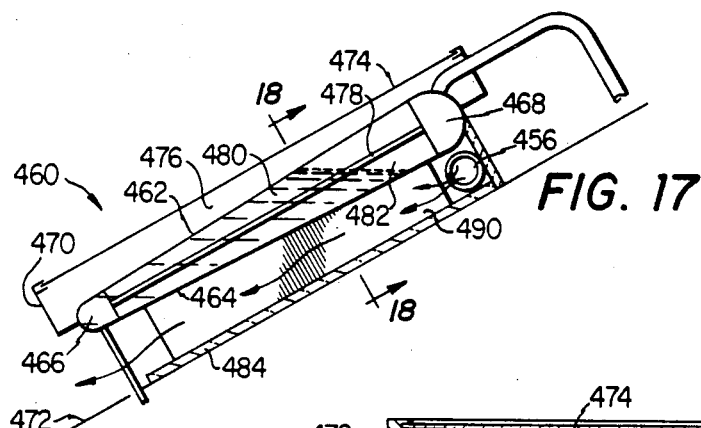
FIG. 17 is an end view of the thermal collector of the apparatus of FIG. 16 in which certain parts have been broken away more clearly to illustrate certain features thereof.
Figure 18:
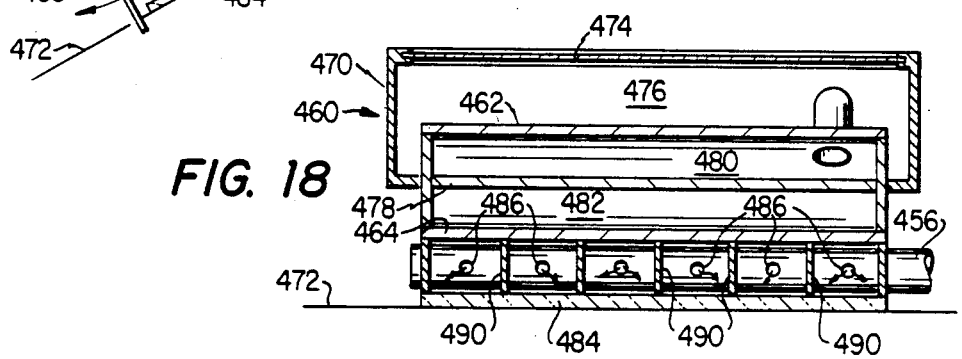
FIG. 18 is a sectional view taken generally along the line 18—18 in FIG. 17 in the direction of the arrows.

Referring now to FIGS. 16, 17 and 18 there is shown a fluid heating system 450 which is adapted for actuation both by solar energy and by waste heat. The fluid heating system 450 is utilized in conjunction with an engine 452 which may comprise a diesel engine, a carburetion/ignition engine or any other type of internal or external combustion engine. Typically, the engine 452 is provided with an exhaust pipe 454 which normally serves to discharge exhaust resulting from the operation of the engine directly into the atmosphere. As is well known, most engines discharge an exhaust comprising substantially heated vapors, whereby the exhaust pipe 454 functions to dissipate waste heat into the atmosphere together with products of combustion comprising the engine exhaust. In accordance with the present invention, the exhaust resulting from operation of the engine 452 is not immediately discharged into the atmosphere, but instead is directed through a conduit 456 and valve 458 to a thermal collector assembly 460. The function of the valve 458 is to control the amount of exhaust that is received by the thermal collector assemby 460 and to discharge the remainder directly into the atmosphere.

Referring specifically to FIG. 17, the thermal collector assembly 460 includes first and second plates 462 and 464 each formed from a thermally conductive material. The plates 462 and 464 may be specially formed for strength, if desired. The first and second plates 462 and 464 define a refrigerant heating chamber therebetween. The plates 462 and 464 extend in divergent planes to define a refrigerant receiving zone 466 wherein the plates 462 and 464 are positioned relatively close to one another and a refrigerant discharge zone 468 wherein the plates 462 and 464 are positioned relatively apart from each other.

A frame 470 supports the plates 462 and 464 and the refrigerant heating zone defined therebetween on a surface 472 or other suitable support. The frame 470 supports the plate 464 in a spaced apart relationship with respect to the surface 472. The frame 470 includes a plate 474 which is transparent to solar radiation. The plate 474 together with the other components of the frame 470 form a closed chamber 476 surrounding the plate 462 of the thermal collector assembly 460.

A third plate 478 formed from a thermally insulating material is positioned within the refrigerant heating zone defined between the first and second plates 462 and 464. The third plate 478 is positioned substantially equidistant from the first and second plates 462 and 464, and extends the entire distance between the refrigerant receiving zone 466 and the refrigerant discharge zone 468. The third plate 478 divides the refrigerant heating chamber into a first refrigerant path 480 extending adjacent the first plate 462 and a second refrigerant path 482 extending adjacent the second plate 464. Refrigerant in the first refrigerant path 480 is adapted for heating by solar radiation which passes through the plate 474 of the frame 470 and through the first plate 462 to heat refrigerant in the first refrigerant path.

The conduit 456 extends to a discharge end situated adjacent to the plate 464 of the thermal collector assembly 460. A layer of thermal insulation 484 extends downwardly from the discharge end of the conduit 456 in a spaced apart relationship with respect to the plate 464. As is best shown in FIG. 18, the discharge end of the conduit 456 is provided with a plurality of outlet holes 486. A plurality of fins 490 are situated between the plate 464 and the layer of insulation 484 to direct exhaust flowing through the conduit 456 and the outlet holes 486 thereof along paths extending adjacent to the plate 464.

The thermal collector assembly 460 is adapted for use in any of the fluid heating systems 20, 120 or 160 shown in FIGS. 1, 2 and 3 respectively. When the sun is shining, solar radiation is received through the plate 474 and through the plate 462, thereby heating refrigerant in the first refrigerant path 480. In addition, exhaust from the engine 452 is directed through the conduit 456 and through the outlets 486 thereof. Heat from the exhaust passes through the second plate 464 and functions to heat the refrigerant in the second refrigerant path 482. Thus, the thermal collector assembly 460 is adapted for actuation either by solar energy, or by the extraction of waste heat from the exhaust from the engine 452, or both.

Figure 19:
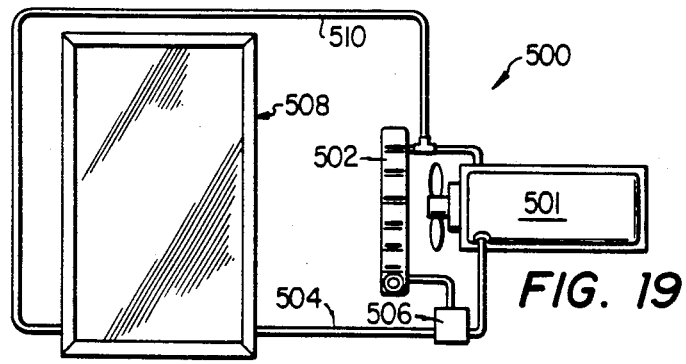
FIG. 19 is an illustration of the invention that is adapted for actuation by solar energy and by waste heat extracted from the coolant of an engine.
Figure 20:
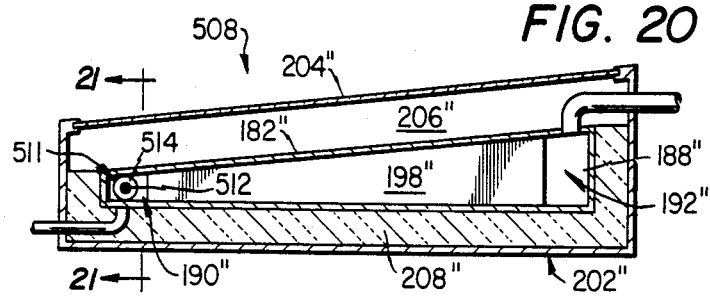
FIG. 20 is an end view of the thermal collector of the apparatus of FIG. 19 in which certain parts have been broken away more clearly to illustrate certain features thereof.
Figure 21:
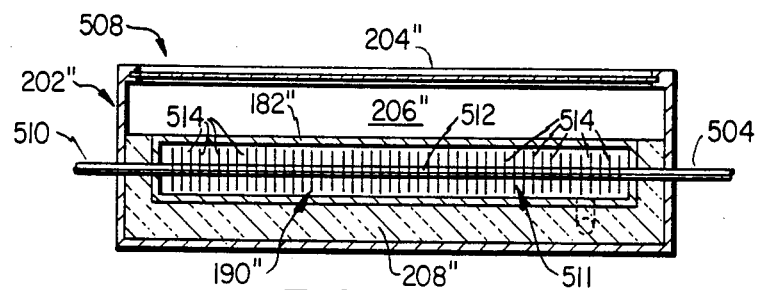
FIG. 21 is a sectional view taken generally along the line 21—21 in FIG. 20 in the direction of the arrows.

Referring to FIGS. 19, 20 and 21, there is shown a fluid heating system 500 adapted for actuation both by solar energy and by waste heat. The fluid heating system 500 includes an engine 501 comprising one of the various liquid cooled varieties. As such, the engine 501 includes a radiator 502 which is normally utilized to extract waste heat from the liquid coolant flowing through the engine 501 and to discharge waste heat into the ambient atmosphere.

In the construction of the fluid heating system 500, a line 504 is extended from the inlet of the radiator 502 through a valve 506 to a thermal collector assembly 508. A line 510 in turn extends from the thermal collector assembly 508 to the outlet of the radiator 502. The function of the valve 506 is to control the amount of liquid flowing from the engine to the thermal collector assembly 508 and to direct the remainder of the liquid coolant to the radiator 502.

The thermal collector assembly 508 incorporates numerous component parts which are substantially identical in construction and function to component parts of the thermal collector assembly 180 illustrated in FIG. 5. Such identical component parts are designated in FIGS. 19, 20 and 21 with the same reference numerals utilized above in the description of the thermal collector assembly 180, but are differentiated therefrom by means of a double prime (") designation.

Referring to FIGS. 20 and 21, the fluid heating system 500 includes a heat transfer assembly 511 situated within the refrigerant receiving zone 190" of the thermal collector assembly 508. The heat transfer assembly 511 includes a liquid conduit 512 connected at one end to the line 504 and connected at the other end to the line 510. The conduit 512 may be provided with a plurality of fins 514 or may be otherwise constructed to facilitate the transfer of heat between liquid coolant flowing therethrough and refrigerant received in the zone 190" of the thermal collector assembly 508.

It will thus be understood that whenever the sun is shining, solar energy is received through the plate 204" and the plate 182", thereby heating refrigerant within the thermal collector 508. Also, liquid coolant is directed from the engine 501 through the line 504 to the heat transfer assembly 511, thereby vaporizing refrigerant within the refrigerant receiving zone 190" to permit operation of the thermal collector assembly 508. It will thus be understood that the thermal collector assembly 500 is adapted for use in conjunction with any of the fluid heating systems 20, 120 or 160 shown in FIGS. 1, 2 and 3, respectively, regardless of whether or not thermal energy is present at any particular time.

It will be further understood that the structure of the fluid heating system 450 as illustrated in FIGS. 16, 17 and 18 may be combined with the structure of the fluid heating system 500 as illustrated in FIGS. 19, 20 and 21, if desired. In such instances the thermal collector assembly is adapted for actuation by solar energy and by waste heat extracted both from engine exhaust resulting from operation of the engine and from liquid coolant that is directed through the engine to regulate the temperature thereof. The use of such a combined system is advantageous in those instances in which waste heat from a relatively small engine is utilized to effect heating of a relatively large quantity of fluid.

Figure 22:
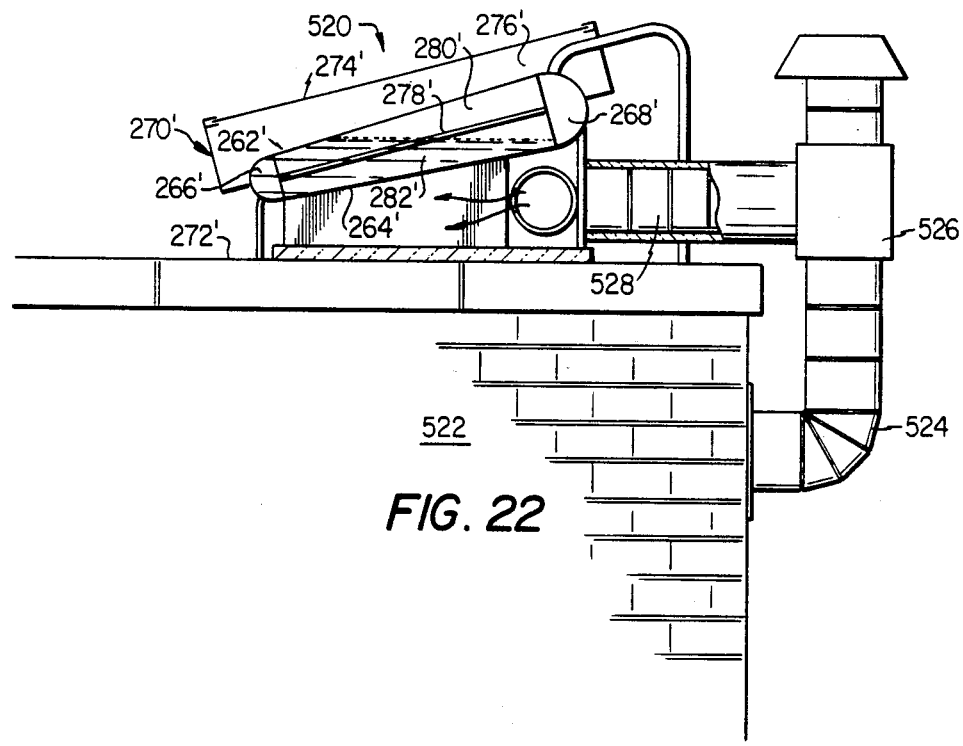
FIG. 22 is an illustration of a version of the invention that is adapted for actuation by solar energy and by waste heat resulting from the operation of a building.

Referring now to FIG. 22, there is shown a fluid heating system 520 adapted for actuation both by solar energy and by waste heat. The fluid heating system 520 utilizes numerous component parts which are substantially identical in construction and function to component parts. Such component parts are designated in FIG. 22 with the same reference numerals utilized in the description of the thermal collector assembly 260, but are differentiated therefrom by means of a prime (') designation.

The fluid heating system 520 is also similar in many respects to the fluid heating system 450 shown in FIGS. 16, 17 and 18 and to the fluid heating system 500 shown in FIGS. 19, 20 and 21 respectively. However, as opposed to being actuated by waste heat resulting from the operation of an engine, the fluid heating system 520 is adapted for actuation by waste heat resulting from the operation of building 522. As is well known, many buildings employ ventilating systems which exhaust heated air into the ambient atmosphere. Alternatively, the building 522 may employ an air conditioning system which functions to exhaust waste heat into the ambient atmosphere.

In either event, heat-laden exhaust air resulting from operation of the building 522 is directed through a conduit 524, through a valve 526 and through a conduit 528 into the space between the roof 272' of the building 522 and the plate 264' of the thermal collector assembly 260'. The function of the valve 526 is to regulate the amount of heat-laden exhaust air that is directed into the space between the roof 272' and the plate 264', and to discharge the remainder of the heat-laden exhaust air flowing through the conduit 524 directly into the ambient atmosphere. It will thus be understood that the thermal collector assembly 260'' of the fluid heating system 520 is adapted for actuation by solar energy, or by the extraction of waste heat resulting from operation of the building 522, or both. Under conditions of substantial sunlight, solar energy is utilized to heat refrigerant in the first refrigerant path 280'. In addition, heat-laden exhaust air resulting from operation of the building 522 is directed into the space between the roof 272' and the plate 264', thereby vaporizing refrigerant in the second refrigerant path 282' by the extraction of heat from the heat-laden exhaust air.

Although preferred embodiments of the invention have been illustrated in the accompanying Drawings and described in the foregoing Detailed Description, it will be understood that the invention is not limited to the embodiments disclosed, but is capable of numerous rearrangements, modifications, and substitutions of parts and elements without departing from the spirit of the invention.

I claim:

1. For use in conjunction with a source of waste heat, a thermal collector comprising:

an enclosure including first and second plates each formed from a thermally conductive material, said enclosure having a refrigerant receiving zone and a refrigerant vapor discharge zone;

liquid conduit means having a first portion for delivering refrigerant to said refrigerant receiving zone, and a second portion for delivering a vapor component of said refrigerant from said collector;

a third plate formed from a thermally insulating material and being positioned within the enclosure between the first and second plates to divide the enclosure into first and second refrigerant paths, said first refrigerant path located between said first and third plates and said second refrigerant path located between said second and third plates;

said refrigerant being normally supported in both said first and second refrigerant paths, with said third plate being normally partially submerged in said refrigerant receiving zone;

means supporting the enclosure with the first plate positioned for contact by sunlight so that the refrigerant within the first refrigerant path is heated primarily by solar energy; and means for directing a waste heat-laden fluid from the waste heat source into engagement with the second plate so that the refrigerant within the second refrigerant path is heated primarily by said waste heat-laden fluid, said third plate serving to prevent heat dissipation from said second refrigerant path when solar energy is not being received by said collector.

2. For use in conjunction with an engine of the type that normally discharges heat-laden exhaust gases into the atmosphere, a thermal collector comprising:

an enclosure including first and second plates each formed from a thermally conductive material, said enclosure having a refrigerant receiving zone and a refrigerant discharge zone;

liquid conduit means having a first portion for delivering refrigerant to said refrigerant receiving zone, and a second portion for delivering a vapor component of said refrigerant from said collector;

a third plate formed from a thermally insulating material and being positioned within the enclosure between the first and second plates to divide the enclosure into first and second refrigerant paths, said first refrigerant path located between said first and third plates and said second refrigerant path located between said second and third plates;

said refrigerant being normally supported in both said first and second refrigerant paths, with said third plate being normally partially submerged in said refrigerant receiving zone;

means supporting the enclosure with the first plate positioned for contact by sunlight so that the refrigerant within the first path is heated primarily by solar energy;

means for directing heat-laden exhaust gases from the engine into engagement with the second plate so that the refrigerant within the second refrigerant path is heated primarily by said waste heat-laden fluid, said third plate serving to prevent heat dissipation from said second refrigerant path when solar energy is not being received by said collector.

3. For use in conjunction with a building of the type that normally exhausts heat-laden air into the ambient atmosphere, a thermal collector comprising:

an enclosure including first and second plates each formed from a thermally conductive material, said enclosure having a refrigerant receiving zone and a refrigerant vapor discharge zone;

liquid conduit means having a first portion for delivering refrigerant to said refrigerant receiving zone, and a second portion for delivering a vapor component of said refrigerant from said collector;

a third plate formed from a thermally insulating material and being positioned within the enclosure between the first and second plates to divide the enclosure into first and second refrigerant paths, said first refrigerant path located between said first and third plates and said second refrigerant path located between said second and third plates;

said refrigerant being normally supported in both said first and second refrigerant paths, with said third plate being normally partially submerged in said refrigerant receiving zone;

means supporting the enclosure with the first plate positioned for contact by sunlight so that the refrigerant within the first refrigerant path is heated primarily by solar energy; and means for directing heat-laden exhaust air from the building into engagement with the second plate so that the refrigerant within the second refrigerant path is heated primarily by said heat-laden exhaust air, said third plate serving to prevent heat dissipation from said second refrigerant path when solar energy is not being received by said collector.

* * * * *